United States Patent [19]

Jacobsen

[11] 4,412,141
[45] Oct. 25, 1983

[54] THREE STATE LOOP KEYER

[75] Inventor: Christian C. Jacobsen, Brookfield, Conn.

[73] Assignee: General DataComm Industries, Inc., Danbury, Conn.

[21] Appl. No.: 217,098

[22] Filed: Dec. 16, 1980

[51] Int. Cl.³ .................... H03K 17/04; H03K 17/28
[52] U.S. Cl. .................................. 307/471; 307/255; 307/270; 307/262
[58] Field of Search ............... 307/471, 262, 270, 255, 307/351

[56] References Cited

U.S. PATENT DOCUMENTS

| 3,479,531 | 11/1969 | Gauld | 307/255 |
| 4,052,558 | 10/1977 | Patterson | 307/471 |
| 4,140,927 | 2/1979 | Feucht | 307/262 |

FOREIGN PATENT DOCUMENTS

| 1028090 | 5/1966 | United Kingdom . |
| 1258442 | 12/1971 | United Kingdom . |
| 1264004 | 2/1972 | United Kingdom . |
| 2015285A | 9/1979 | United Kingdom . |

Primary Examiner—Stanley D. Miller
Assistant Examiner—B. P. Davis
Attorney, Agent, or Firm—Pennie & Edmonds

[57] ABSTRACT

A transistorized keying circuit is described which provides for both polar and neutral interfacing. The circuit comprises an oscillator, an AND gate, an exclusive OR gate, a transformer, and two similar output circuits each of which is connected to the secondary of the transformer. The oscillator produces a high frequency binary output signal having an asymmetric duty cycle. The output of the oscillator and a low frequency data signal are applied to the AND gate. The output of the AND gate and another low frequency data signal are applied to the exclusive OR gate whose output is amplified and applied to the primary of the transformer. Each output circuit coupled to the secondary of the transformer comprises a switching transistor for switching a supply voltage onto a transmission line and a peak detector for controlling the operation of the switching transistor. When the AND gate is enabled and the output signal from the exclusive OR gate is the oscillator output signal, only one of these transistors is switched ON; and when the output of the oscillator gate is the inverted signal only the other transistor is switched ON. When the AND gate is disabled, neither transistor is switched on. For polar operation of this circuit, the opposite end of the transmission line is connected through a load resistor to voltage supply common. For neutral operation either the AND gate can be enabled and disabled or the load resistor can be connected to voltage supply positive or negative.

9 Claims, 2 Drawing Figures

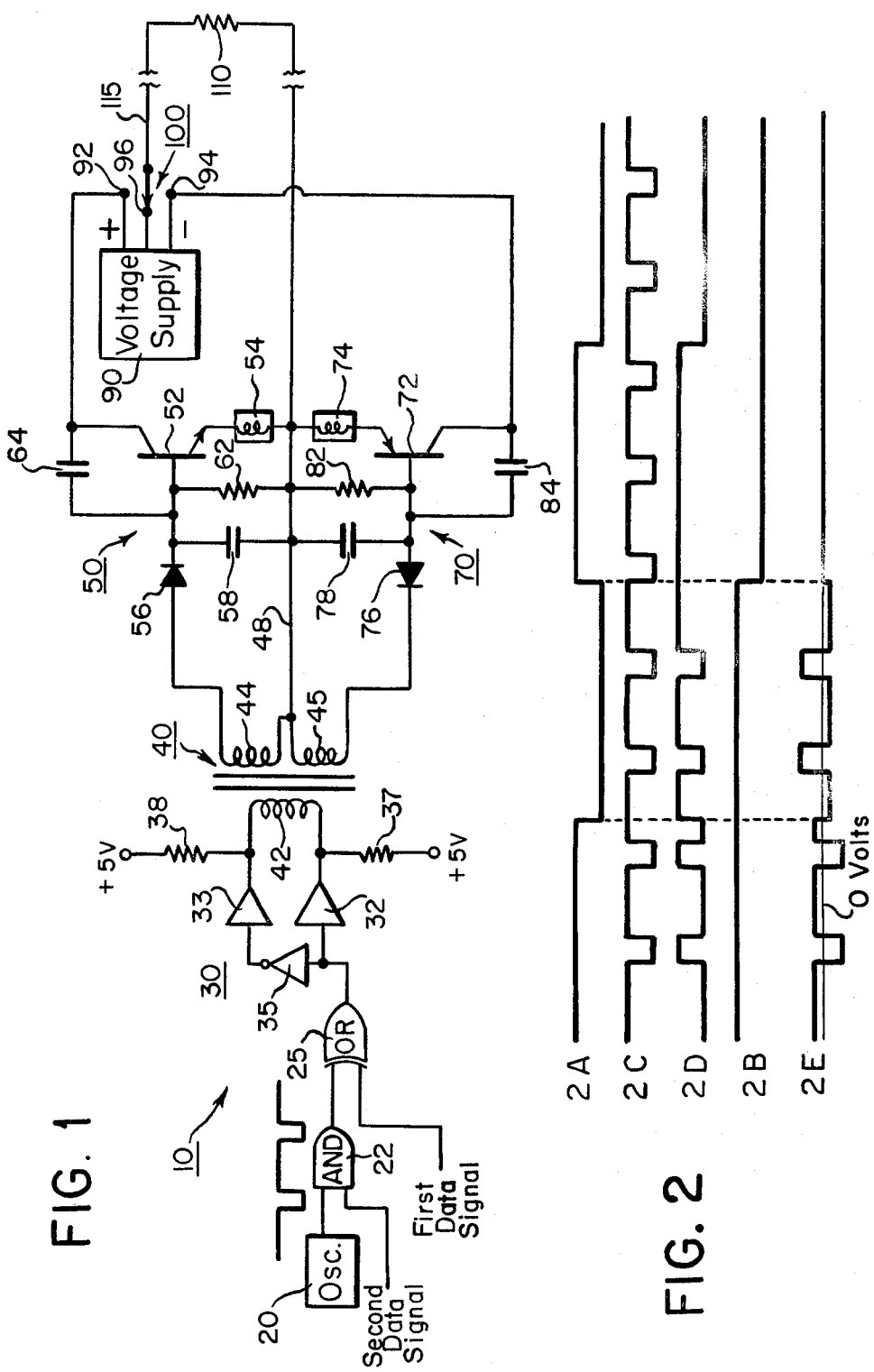

4,412,141

THREE STATE LOOP KEYER

TECHNICAL FIELD

This relates to a solid state keying circuit capable of providing both neutral and polar current outputs at an isolation interface in a communication system or the like. As is known in the art, in a polar system the output signal is an electric current which flows in either one direction or the other direction. In a neutral system the output signal is either the presence or the absence of an electric current. In a preferred embodiment of the invention to be described, the keying circuit provides three state operation of positive voltage to load, negative voltage to load and no voltage to load.

BACKGROUND OF THE INVENTION

In a data communication system it is necessary to isolate the terminal apparatus from the transmission line so as to protect the terminal apparatus and those who use it from line hazards such as lightning. Typically, electromechanical relays or opto-electric isolation circuits are used for this function; and it is known in the art to provide polar or neutral interfacing with such relays or opto-electric isolators. For example, a Form C style electromagnetic relay may be used to provide a three state keyer. Relays, however, tend to be slow, cumbersome, expensive and a considerable current drain. While many of the problems of relays are avoided or reduced by the use of opto-electric isolators, such devices still require fairly complicated circuitry for their operation and cause a significant current drain in their operation.

DISCLOSURE OF THE INVENTION

I have devised a transistorized keying circuit which provides for both polar and neutral interfacing in a simple isolation circuit with a minimum number of parts. The circuit comprises an oscillator, an AND gate, an exclusive OR (XOR) gate, an isolating transformer, and two similar output circuits connected to the secondary of the transformer. Two low frequency data signals are used in the practice of the preferred embodiment of the invention, the first being applied to one input to the XOR gate and the second being applied to one input to the AND gate. The oscillator produces a high frequency rectangular wave output signal having an asymmetric duty cycle. When the AND gate is enabled by the second data signal, the output of the oscillator is applied to the XOR gate along with the first data signal. As will be understood by those skilled in the art, if the AND gate is enabled, the output of the XOR gate is the oscillator output signal when the first data signal is in one state and is the inverted oscillator output signal when the first data signal is in the other state. If the AND gate is disabled, the output of the XOR gate is the first data signal.

The output of the XOR gate is buffered and applied to the primary of the isolating transformer. Each output circuit coupled to the secondary of the transformer comprises a switching transistor for switching a supply voltage onto a transmission line and a peak detector for controlling the operation of the switching transistor. When the output signal from the XOR gate is the oscillator output signal, only one of these transistors is switched on; and when the output of the XOR gate is the inverted oscillator signal, only the other transistor is switched on. When the AND gate is disabled, neither transistor is switched on.

For polar operation of this circuit, the opposite end of the transmission line is connected through a load resistor to neutral. Since the supply voltages have opposite polarities, current flow in the transmission line is in one direction when one transistor is switched on and is in the opposite direction when the other transistor is switched on, thereby producing a polar output.

If neither transistor is switched on, as is the case when the AND gate is disabled, there is no current flow in the transmission line and the circuit operates as a neutral system. As a result, the keying circuit provides three state operation of positive voltage to load, negative voltage to load and no voltage to load.

Alternatively, for neutral operation of this circuit, the opposite end of the transmission line is connected through a load resistor to the output terminal of one of the voltage supplies. For this circuit configuration, there is no current flow when the transistor that is switched on and the load resistor are connected to the same terminal of the power supply. However, when the other transistor is turned on, there is current flow. Advantageously, the direction of current flow can be selected by selecting the voltage supply terminal to which the load resistor is connected.

BRIEF DESCRIPTION OF THE DRAWINGS

These and other objects, features, elements and advantages of the invention will be readily apparent from the following drawings in which:

FIG. 1 is a schematic diagram of an illustrative embodiment of the circuit of the invention; and FIGS. 2A through 2E set forth illustrative wave forms of the signals present at various points in the circuit of FIG. 1.

BEST MODE OF CARRYING OUT THE INVENTION

As shown in FIG. 1, a keying circuit 10 comprises an oscillator 20, an AND gate 22, an exclusive OR (XOR) gate 25, a driver circuit 30, a transformer 40, an output transmission line 48, a first switching circuit 50, a second switching circuit 70, a power supply 90, a third switching circuit 100 and a load resistor 110. A first data signal is applied to one input to XOR gate 25; and a second data signal is applied to one input to AND gate 22. Driver circuit 30 comprises amplifiers 32, 33, inverter 35 and biasing resistors 37, 38. Transformer 40 comprises a primary winding 42 and secondary windings 44, 45, polarized as shown in FIG. 1 and having a 1:1:1 turns ratio. Output transmission line 48 is connected to a center tap between windings 44 and 45.

Switching circuit 50 comprises a NPN switching transistor 52, the collector of which is connected to a positive terminal 92 of voltage supply 90; an inductor 54 connecting the emitter of transistor 52 to output transmission line 48; a first peak detector comprising a diode 56, a capacitor 58, and a resistor 62 coupled to the base of transistor 52; and a capacitor 64 across the base-collector junction of transistor 52. As shown in FIG. 1, the p-side of diode 56 is coupled to the dotted side of winding 44; and capacitor 58 and resistor 62 are connected in parallel between the base of transistor 52 and output line 48.

Switching circuit 70 is similar and comprises PNP switching transistor 72 with its emitter connected through an inductor 74 to output line 48 and its collector connected to a negative terminal 94 of voltage supply 90; a second peak detector comprising a diode 76, a capacitor 78, and a resistor 82 coupled to the base of transistor 72; and a capacitor 84 across the base-collector junction. Diode 76 is poled in the opposite direction to that of diode 56 so that its n-side is connected to the dotted side of winding 45. Capacitor 78 and resistor 82 are connected in parallel between the base of transistor 72 and output line 48.

Switching circuit 100 provides for the connection of transmission line load resistor 110 to any one of the positive, negative and neutral (or common) terminals 92, 94, 96, respectively, of voltage supply 90. As will be detailed below, keying circuit 10 functions as a polar system when AND gate 22 is enabled and transmission line 56 is connected through resistor 100 to the common terminal of voltage supply 90. Circuit 10 functions as a neutral system when AND gate 22 is switched ON and OFF by the second data signal or when resistor 110 is connected to either the positive or negative terminal of voltage supply 90.

Oscillator 20 produces a rectangular wave form having a duty cycle of approximately 25%/75% (i.e., signals of one polarity approximately 25% of the time and of the other polarity for the remaining time) and an output frequency or pulse repetition rate of approximately 300 KHz to 3 MHz. This frequency is well in excess of the frequencies of either data signal which typically range up to almost 5 KHz.

As will be apparent to those skilled in the art, the second data signal controls the application of the oscillator signal to XOR gate 25. When the second data signal has that polarity which disables AND gate 22, no oscillator signal is applied to XOR gate 25 and the output of XOR gate 25 is the first data signal. When the second data signal has opposite polarity so as to enable AND gate 22, the oscillator signal is applied to XOR gate 25; and the output of XOR gate 25 will be the same as the output signal of the oscillator when the first data signal is in one state and will be the inverted output signal of the oscillator when the first data signal is in its other state. Illustrative wave forms for the first and second data signals, the oscillator output, and the output from gate 25 are shown in FIGS. 2A, 2B, 2C and 2D, respectively.

The output of gate 25 is applied to driver circuit 30. The output is buffered by amplifier 32. It is also inverted by inverter 35 and the inverted signal is buffered by amplifier 33. The resulting signal is applied to the primary winding 42 of transformer 40.

Transformer 40 blocks the d.c. component in the output signal from gate 25. As a result, when the output signal is the relatively low frequency first data signal, no usable signal is induced in the secondary windings. When the relatively high frequency oscillator signal is applied to the primary winding, the oscillator signal is induced in the secondary windings, but the voltage levels in the induced signal shift so as to eliminate any d.c. bias. In particular, the integral over time of the positive portions of the data signal in the secondary windings is equal to the integral over time of the negative portions of the data signal. Since the data signal is an asymmetric rectangular wave, this causes the portion of the data signal having a shorter duration to have a larger peak amplitude. As will be detailed below, this peak amplitude is detected by peak detectors 56, 58, 62 and 76, 78, 82 and used to control switching transistors 52, 72, respectively. An illustrative waveform depicting the signal at the dotted terminal of secondary windings 44, 45 is shown in FIG. 2E.

When the inverted oscillator signal is the output from gate 25, the voltage signal at the dotted terminal of primary winding 42 will be positive with respect to the other terminal for approximately 75% of the oscillator duty cycle. Hence the voltage signal induced at the dotted terminals of secondary windings 44, 45 will likewise be positive with respect to line 48 for about 75% of the oscillator duty cycle. When the voltage is positive at the dotted terminals, diode 56 will conduct and this voltage will be stored in capacitor 58 of the first peak detector. At the same time diode 76 will be non-conductive since it is reverse-biased and any signal on capacitor 78 will partially discharge through resistor 82. For about 25% of the oscillator duty cycle, the situation will be reversed and the dotted terminals will be negative with respect to line 48. At that time, diode 56 will be reverse-biased and capacitor 58 will discharge through resistor 62; but diode 76 will be conductive so as to store a negative voltage in capacitor 78 of the second peak detector.

Since the positive integral and the negative integral in the signals induced in the secondary windings are equal, the peak negative voltage will be much greater than the peak positive voltage when the signal is negative for only about 25% of the time. As a result, the voltage stored on capacitor 78 will be much greater than that stored on capacitor 58. In particular, in accordance with the invention, the length of the oscillator duty cycle is selected in light of the switching properties of transistors 52, 72 so that the voltage stored on capacitor 78 is enough to switch transistor 72 ON while that stored on capacitor 58 is not enough to switch transistor 52 ON. In addition, the discharge time constant of the resistor-capacitor networks 58, 62 and 78, 82 are chosen so that (1) once a transistor is switched ON it stays ON for as long as the first data signal has the same polarity and (2) charge does not accumulate over successive oscillator cycles in the capacitor which is connected to the transistor which is not switched ON. Finally, to prevent one transistor from being switched ON before the other is turned OFF, capacitors 64, 84 are used as Miller capacitors so as to slow down the turn on time of the transistor whose base-collector junction they shunt enough that the other transistor will first turn OFF. As a result, only the negative terminal 94 of voltage supply 90 is connected to line 48 when the output of gate 25 is the inverted oscillator output. Thus one of the two states of the first data signal is converted by keying circuit 10 to a negative voltage signal on line 48.

When the output of gate 25 is not inverted, the operation of circuits 50 and 70 is the opposite and transistor 52 is switched ON by the charge stored on capacitor 58 and remains ON while the charge stored on capacitor 78 is not enough to switch transistor 72 ON. As a result, only the positive terminal 92 of voltage supply 90 is connected to line 48 when the output of gate 25 is in the not inverted state. Thus the other state of the first data signal is converted by keying circuit 10 to a positive voltage signal on line 48.

To operate the apparatus as a polar system, switching circuit 100 is set so that load resistor 110 is connected between output line 48 and common terminal 96 of the voltage supply. Since the load resistor may be a substantial distance from the power supply, it may be advantageous to make this connection through an earth ground.

Alternatively, as shown in FIG. 1, a return line 115 may be used.

As will be apparent, when the load resistor is connected to common and the data signal applied to gate 25 is such that transistor 52 is switched ON, a voltage drop is established across output line 48 and load resistor 110 causing current to flow in one direction through the line and load resistor. When transistor 72 is switched ON, a voltage drop is established in the opposite direction across output line 48 and load resistor 110 causing current to flow in the direction opposite to that when transistor 52 is turned ON. As a result, keying circuit 10 reproduces the two-state d.c. signals of the first data signal on the secondary side of transformer 40 as the polar signals of a positive d.c. voltage to load and a negative d.c. voltage to load.

To operate the apparatus as a neutral system, either the second data signal may be used to enable and disable AND gate 22 or switching circuit 100 may be set so that load resistor 110 is connected between output line 48 and either positive terminal 92 or negative terminal 94 of the voltage supply. When the second data signal is used to disable AND gate 22, there is no output signal in the secondary windings of transformer 40 because the transformer blocks the low frequency first data signal from XOR gate 25. As a result, neither switching transistor is ON and there is no voltage applied to transmission line 48. Hence, in addition to the signals of positive voltage to load and negative voltage to load, circuit 10 also provides a third signal of no voltage to load.

Alternatively, if load resistor 110 is connected to the positive terminal of the voltage supply, no current will flow when the data signal polarity is such that transistor 52 is switched ON since there is no potential drop across line 48 and resistor 110. On the other hand, when the data signal has opposite polarity so that transistor 72 is switched ON, the potential drop across line 48 and resistor 110 is substantially that across the positive and negative terminals of the voltage supply and a current will flow in one direction through line 48 and resistor 110. If the load resistor is connected to the negative terminal of voltage supply 90, current will flow in the opposite direction through line 48 and resistor 110 when transistor 52 is ON and will not flow when transistor 72 is ON. As a result, current will flow in line 48 only when the output of gate 25 is in one of the two possible states of inverted and not inverted; and the direction of current flow can be controlled by connecting load resistor 110 to either the positive or negative terminal of the voltage supply. Accordingly, for neutral operation, keying circuit 10 reproduces the two-state d.c. data signals as the neutral signals of voltage (either positive or negative) to load and no voltage to load.

Illustrative values and part numbers for the elements of the circuit of FIG. 1 are as follows:
AND gate 22
XOR gate 25: 74LS86
amplifiers 32, 33: 7417
inverter 35: 7404
resistors 37, 38: 620 ohms
transistor 52: 2N3440
transistor 72: 2N5416
inductors 54, 74: 3 microHenries
diodes 56, 76: 1N277
capacitors 58, 78: 0.1 microFarads
resistors 62, 82: 1000 ohms
capacitors 64, 84: 100 picoFarads Illustratively, transformer 40 is a 1:1:1 toroidal wound pulse transformer having an inductance of 1 milliHenry per winding. Such transformers are readily available commercially from suppliers such as Aladdin Electronics of Nashville, Tenn.

For these circuit parameters, keyer 10 works best when oscillator 20 has an output frequency of approximately 3 MHz and a duty cycle of about 25/75%. The upper bound on the duty cycle of the oscillator is dictated by the switching characteristics of transistors 52, 72. For present day silicon transistors the duty cycle should not be more than about 30%/70%. The lower bound on the duty cycle of the oscillator is dictated by the frequency response of transformer 40 and circuits 50, 70. For oscillator frequencies in the range 300 KHz to 3 MHz, the keyer of FIG. 1 will work at duty cycles as low as about 20/80%. Lower duty cycles could be achieved using transformers having better frequency response.

As will be apparent to those skilled in the art, numerous modifications may be made in the above described circuit without departing from the spirit and scope of the invention. Of particular interest, it should be noted that a transformer having a single secondary winding can be used in the practice of the invention simply by connecting both diodes to the dotted terminal of the secondary winding. Moreover, while the embodiment shown in FIG. 1 provides for three state keying (positive voltage to load, negative voltage to load, and no voltage to load), the invention may also be practiced as a two state keyer without AND gate 22. Similarly, if switch 100 is eliminated and load resistor 110 permanently connected to one of the terminals of the voltage supply, the invention may be practiced as a polar system or a neutral system depending on the connection.

What is claimed is:

1. A keying circuit comprising:
   an oscillator which produces a binary output signal having an asymmetric duty cycle,
   a first logic gate to which is applied the output from said oscillator and a first binary data signal, said logic gate producing an output signal which is the exclusive OR of the oscillator signal and the first data signal applied to its inputs,
   a transformer having a primary winding and at least one secondary winding, the output signal from said logic gate being applied to said primary winding,
   a signal transmission line connected to one terminal of each secondary winding,
   first means connected to a secondary winding of said transformer for connecting a voltage source of a first polarity to said signal transmission line when said first data signal has a first signal polarity, and
   second means connected to a secondary winding of said transformer for connecting a voltage source of a second polarity to said signal transmission line when said first data signal has a second signal polarity.

2. The circuit of claim 1 wherein said first means and said second means each comprise a switching transistor and a peak detector comprising a diode and a capacitor connected to the base of said transistor, and said first and second means are designed so that no more than one switching transistor is conductive at any time.

3. The circuit of claim 1 wherein:
   said first means comprises an NPN switching transistor and a peak detector comprising a diode and capacitor connected to the base of said transistor, said second means comprises a PNP switching transistor and a peak detector comprising a diode and capacitor connected to the base of said transistor, the diodes of said peak detector are poled in opposite directions, and the duty cycle of the oscillator is selected so that the signal stored in one peak detector when said binary data signal has one polarity is sufficient to turn ON the transistor to which it is connected while the signal stored in the other peak detector is not sufficient to turn ON the transistor to which it is connected.

4. The keying circuit of claim 2 or claim 3 further comprising means for preventing one transistor from becoming conductive while the other is conductive.

5. The keying circuit of any one of claims 1, 2 or 3 wherein the oscillator output signal is one in which one binary state is present for less than about 30% of the time.

6. The keying circuit of any one of claims 1, 2 or 3 further comprising a load resistor connected to said signal transmission line and to means for connecting it to a positive, negative or a common terminal of said voltage source, whereby when said load resistor is connected to said common terminal the circuit operates as a polar keying system and when the load resistor is connected to either said positive terminal of said negative terminal the circuit operates as a neutral system.

7. The circuit of any one of claims 1, 2 or 3 wherein said transformer has two secondary windings, said first means is connected to one of said secondary windings and said second means is connected to the other of said secondary windings.

8. The circuit of any one of claims 1, 2 or 3 further comprising a second logic gate to which are applied the output of said oscillator and a second binary data signal, said second logic gate producing an output signal which is the AND of the oscillator signal and the second data signal applied to its inputs, said output signal being applied to said first logic gate as the oscillator signal, whereby when said second binary data signal has a first signal polarity said second logic gate is disabled and the output of the first logic gate is the first binary data signal and when said second binary data signal has a second signal polarity said second logic gate is enabled to apply the oscillator output signal to said first logic gate.

9. The circuit of claim 3 wherein the emitters of the NPN and PNP transistors are coupled to the signal transmission line and the collectors of said transistors are coupled to said voltage sources of first and second polarities.

* * * * *